United States Patent
Chen et al.

(10) Patent No.: US 12,482,787 B2
(45) Date of Patent: Nov. 25, 2025

(54) SEMICONDUCTOR PACKAGING AND METHODS OF FORMING SAME

(71) Applicant: Taiwan Semiconductor Manufacturing Co., Ltd., Hsinchu (TW)

(72) Inventors: Hsien-Wei Chen, Hsinchu (TW); Ming-Fa Chen, Taichung (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 17/884,240

(22) Filed: Aug. 9, 2022

(65) Prior Publication Data

US 2022/0384388 A1 Dec. 1, 2022

Related U.S. Application Data

(62) Division of application No. 17/214,043, filed on Mar. 26, 2021, now Pat. No. 11,728,312.

(Continued)

(51) Int. Cl.
*H01L 25/065* (2023.01)
*H01L 21/56* (2006.01)
(Continued)

(52) U.S. Cl.
CPC ........ *H01L 25/0652* (2013.01); *H01L 21/561* (2013.01); *H01L 21/565* (2013.01);
(Continued)

(58) Field of Classification Search
CPC . H01L 25/0652; H01L 21/565; H01L 23/481; H01L 23/544; H01L 24/19; H01L 24/20; H01L 24/32; H01L 24/83; H01L 24/96; H01L 24/97; H01L 2223/54426; H01L 2224/211; H01L 2224/32145;
(Continued)

(56) References Cited

U.S. PATENT DOCUMENTS 6,589,852 B1 7/2003 Shih et al.
9,000,584 B2 4/2015 Lin et al.
(Continued)

FOREIGN PATENT DOCUMENTS

CN 101621012 A * 1/2010 ............ H01L 24/83
DE 102017124104 A1 10/2018
(Continued)

*Primary Examiner* — Mohammad M Choudhry
(74) *Attorney, Agent, or Firm* — Slater Matsil, LLP

(57) ABSTRACT

A package includes a first semiconductor substrate; an integrated circuit die bonded to the first semiconductor substrate with a dielectric-to-dielectric bond; a molding compound over the first semiconductor substrate and around the integrated circuit die; and a redistribution structure over the first semiconductor substrate and the integrated circuit die, wherein the redistribution structure is electrically connected to the integrated circuit die. The integrated circuit die includes a second semiconductor substrate, and wherein the second semiconductor substrate comprises a first sidewall, a second sidewall, and a third sidewall opposite the first sidewall and the second sidewall, and the second sidewall is offset from the first sidewall.

20 Claims, 19 Drawing Sheets

Related U.S. Application Data

(60) Provisional application No. 63/140,290, filed on Jan. 22, 2021.

(51) Int. Cl.
*H01L 23/00* (2006.01)
*H01L 23/48* (2006.01)
*H01L 23/544* (2006.01)

(52) U.S. Cl.
CPC .......... *H01L 23/481* (2013.01); *H01L 23/544* (2013.01); *H01L 24/19* (2013.01); *H01L 24/20* (2013.01); *H01L 24/32* (2013.01); *H01L 24/83* (2013.01); *H01L 24/96* (2013.01); *H01L 24/97* (2013.01); *H01L 2223/54426* (2013.01); *H01L 2224/211* (2013.01); *H01L 2224/32145* (2013.01); *H01L 2224/83* (2013.01); *H01L 2924/3511* (2013.01); *H01L 2924/35121* (2013.01)

(58) Field of Classification Search
CPC ......... H01L 2224/83; H01L 2924/3511; H01L 2924/35121
See application file for complete search history.

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,068,844 B2 | 9/2018 | Chiu et al. | |
| 2014/0241034 A1 | 8/2014 | Tsai et al. | |
| 2014/0291826 A1* | 10/2014 | Ishida | H01L 23/49541 257/676 |
| 2015/0021721 A1* | 1/2015 | Romig | H03H 3/0076 438/51 |
| 2015/0035161 A1* | 2/2015 | Miao | H01L 23/53223 438/460 |
| 2016/0042997 A1 | 2/2016 | Takahashi et al. | |
| 2017/0033058 A1* | 2/2017 | Li | H01L 23/49582 |
| 2017/0250171 A1 | 8/2017 | Yu et al. | |
| 2018/0090443 A1 | 3/2018 | Lee et al. | |
| 2019/0115272 A1* | 4/2019 | Yu | H01L 25/03 |
| 2019/0148336 A1 | 5/2019 | Chen et al. | |
| 2020/0013637 A1 | 1/2020 | Haba | |
| 2020/0020585 A1 | 1/2020 | Wakahara et al. | |
| 2020/0066569 A1 | 2/2020 | Priewasser et al. | |
| 2020/0343183 A1 | 10/2020 | Chen et al. | |
| 2020/0402942 A1 | 12/2020 | Chen et al. | |
| 2020/0411444 A1 | 12/2020 | Tsai et al. | |

FOREIGN PATENT DOCUMENTS

| | | | |
|---|---|---|---|
| DE | 102019210185 A1 | 1/2020 | |
| DE | 102018214337 A1 | 2/2020 | |
| DE | 102020108481 A1 | 4/2021 | |
| KR | 20160026860 A | 3/2016 | |
| KR | 20180035365 A | 4/2018 | |
| KR | 20190055694 A | 5/2019 | |
| KR | 20200106929 A | 9/2020 | |
| TW | 202040783 A | 11/2020 | |
| TW | 202101613 A | 1/2021 | |
| TW | 202101724 A | 1/2021 | |
| WO | WO-2015123804 A1 * | 8/2015 | ............. H05K 1/189 |
| WO | 2019168763 A1 | 9/2019 | |

* cited by examiner

SEMICONDUCTOR PACKAGING AND
METHODS OF FORMING SAME

PRIORITY CLAIM AND CROSS-REFERENCE

This application is a divisional of U.S. application Ser. No. 17/214,043, filed on Mar. 26, 2021, which claims the benefit of U.S. Provisional Application No. 63/140,290, filed on Jan. 22, 2021, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
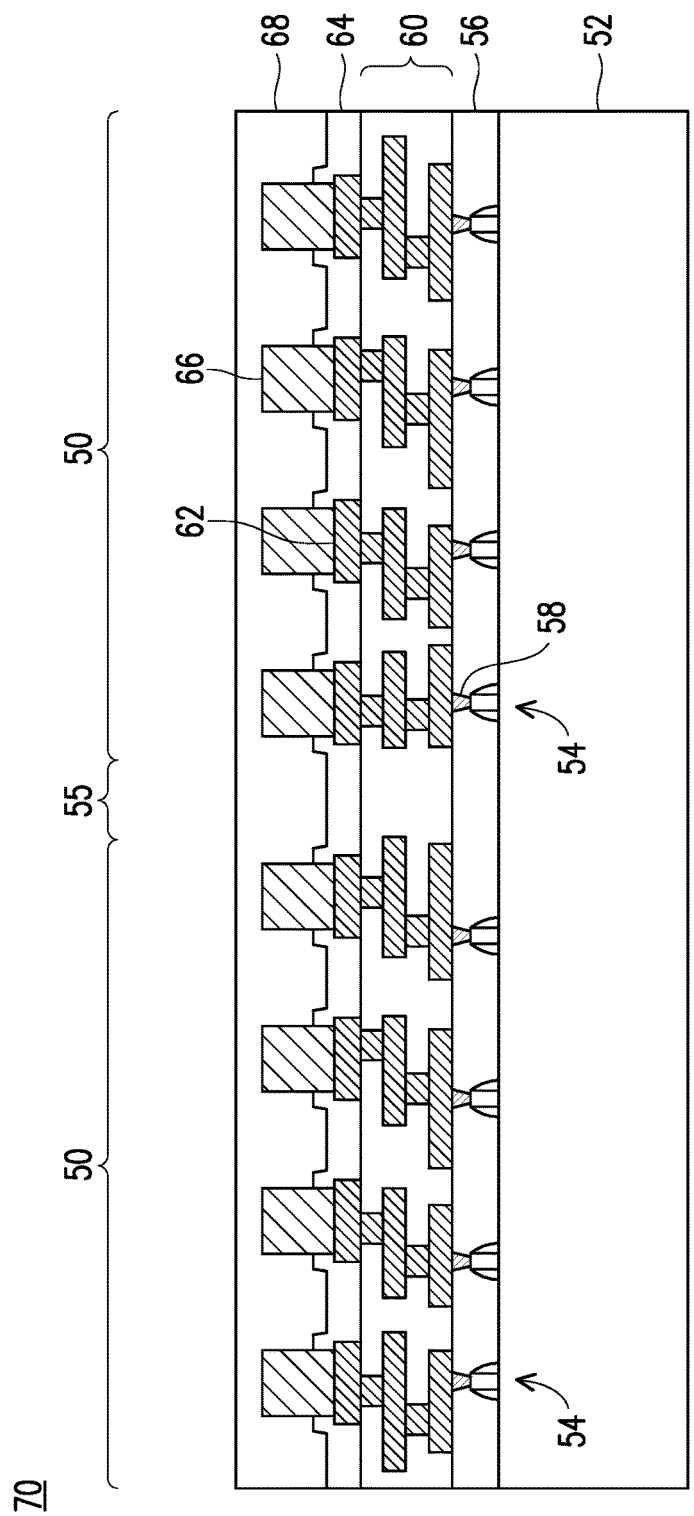
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a semiconductor package includes a molded die that is bonded to a bulk semiconductor substrate, such as a bulk silicon substrate or the like. The semiconductor substrate can increase the volume of semiconductor material in the package to improve thermal dissipation. Further, the semiconductor substrate is not encapsulated in a molding compound, and the inclusion of the semiconductor substrate does not significantly increasing the volume of the molding compound in the semiconductor package. As a result, defects associated with increased molding compound volume, such as poor warpage control or the like, can be avoided.

FIG. 1 illustrates a cross-sectional view of integrated circuit dies 50 in accordance with some embodiments. The integrated circuit dies 50 will be packaged in subsequent processing to form an integrated circuit package. Each integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit dies 50 may be formed in a wafer 70, which may include different multiple integrated circuit dies 50 that are separated by scribe line regions 55. The integrated circuit dies 50 may be processed according to applicable manufacturing processes to form integrated circuits. For example, each integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices (represented by a transistor) 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit dies 50 further include pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit dies 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether each integrated circuit die 50 is a known good die (KGD). Thus, only integrated circuit dies 50, which are KGDs, undergo subsequent processing are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68.

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

Figure 2:
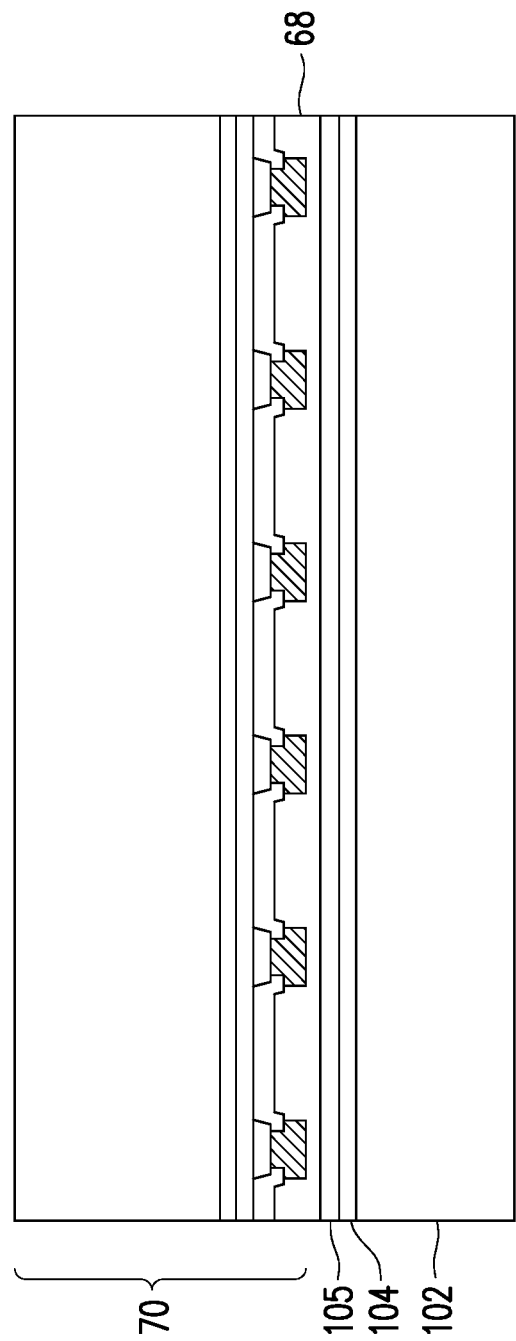
FIGS. 2, 3, 4, 5A, 5B, 6A, 6B, 6C, 7, 8, 9, 10, 11, 12A, 12B, and 12C illustrate cross-sectional views of intermediate steps during a process for forming a package component in accordance with some embodiments.

FIGS. 2 through 6C illustrate intermediate steps of singulating the integrated circuit dies 50 from the wafer 70 according to some embodiments. In FIG. 2, a carrier substrate 102 is provided, and a bonding film 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The bonding film 104 may deposited over the carrier substrate 102. The bonding film 104 may comprise silicon oxide, silicon nitride, silicon oxynitride, or the like, and the bonding film 104 may be deposited using a suitable deposition process such as chemical vapor deposition (CVD), physical vapor deposition (PVD), atomic layer deposition (ALD), or the like. Optionally, a planarization step may then be performed to level a top surface of the bonding film 104 such that the bonding film 104 has a high degree of planarity.

The wafer 70 comprising the integrated circuit dies 50 is attached to the carrier substrate 102 and bonding film 104 by an bonding layer 105. The bonding layer 105 may be formed a similar material as the bonding layer 104, and the bonding film 105 may be deposited on a front side surface of the wafer 70 using a similar process as the bonding film 104. For example, the bonding film 105 may be deposited over the dielectric layer 68 of the wafer 70 by CVD, PVD, ALD, or the like.

The wafer 70 is attached face down such that the front sides of the wafer 70 faces the carrier substrate 102 and the bonding film 105 is directly bonded to the bonding layer 104 by an oxide-to-oxide bond or the like. An example bonding process starts by applying a surface treatment to one or more of the bonding layers 104 or 105. The surface treatment may include a plasma treatment, which may be performed in a vacuum environment. After the plasma treatment, the surface treatment may further include a cleaning process (e.g., a rinse with deionized water, or the like) that may be applied to one or more of the bonding layers 104 or 105. The bonding process may then proceed to aligning wafer 70 to the carrier substrate 102. Next, the bonding process includes a pre-bonding step during which the bonding layer 105 of the wafer 70 is put in contact with the bonding layer 104 on the carrier substrate 102. The pre-bonding may be performed at room temperature (e.g., between about 21° C. and about 25° C.). The bonding process continues with performing an anneal, for example, at a temperature between about 150° C. and about 400° C. for a duration between about 0.5 hours and about 3 hours, so that oxide-to-oxide bonds are formed between the bonding layers 104 and 105.

Figure 3:
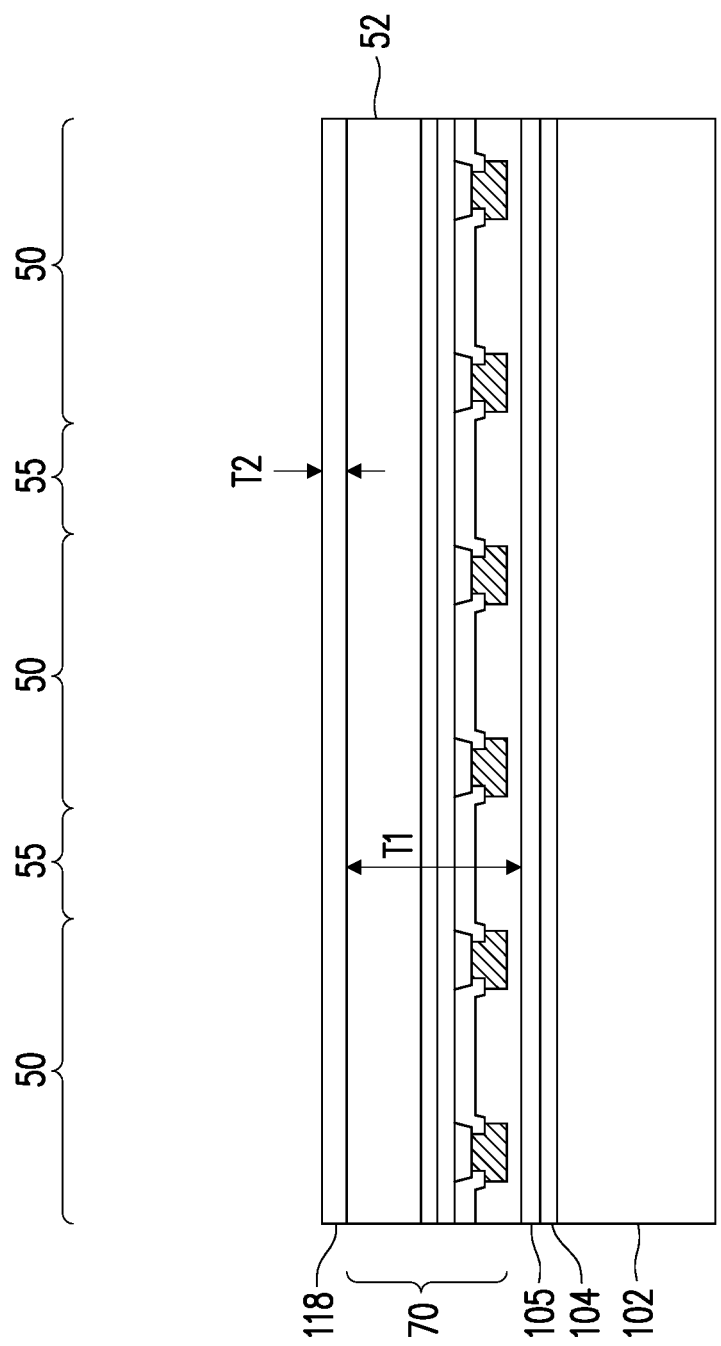

In FIG. 3, the wafer 70 is thinned. The thinning process may include a mechanical polish, a CMP process, an etch back process, or the like that is applied to the substrate 52 of the wafer 70. In subsequent processes, a molding compound may be formed around singulated dies 50 of the wafer 70. Accordingly, by thinning the wafer 70, a volume of molding compound used subsequently may be reduced for improved warpage control. Further, thinning the wafers 70 may facilitate and reduce defects (e.g., delamination) resulting from subsequent singulation processes. After thinning, the wafer 70 may have a thickness T1 in a range of about 150 µm to about 200 µm. It has been observed that when the wafer 70 is thinned beyond this range (e.g., when the thickness T1 is less than about 150 µm), thermal dissipation is not sufficient in the resulting package. It has been observed that when the wafer 70 is thinned too little (e.g., when the thickness T1 is greater than about 200 µm), excess molding compound is used to encapsulate the dies 50, and the resulting package has poor warpage control.

As further illustrated by FIG. 3, a bonding film 118 is deposited on the back side of wafer 70. The bonding film 118 may be deposited using a similar method and be formed of a similar material as the bonding film 104 described above. In some embodiments, the bonding film 118 may have a thickness T2 in a range of about _1,000 Å_ to about _5,000 Å_.

Figure 4:
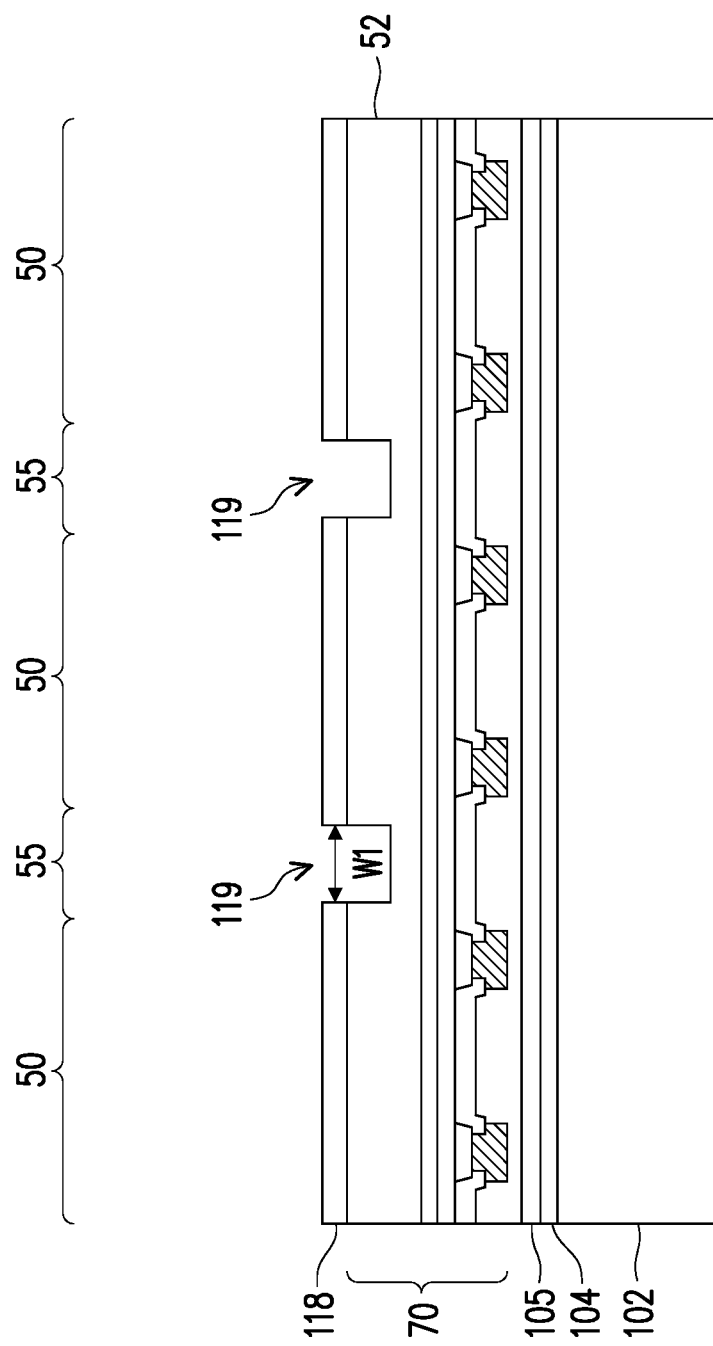

In FIG. 4, the bond film 118 and substrate 52 of the wafers 70 may be patterned to form recesses 119 in scribe line regions 55. Patterning the recesses 119 may be done be a combination of photolithography and etching, for example. The etching process may be a dry etch process in some embodiments, and the etching process may further be anisotropic. After etching, an optional cleaning process may be applied to remove etching residue and other contaminants from surfaces of the substrate 52 that are exposed by the recesses 119. The resulting recesses 119 may have a width W1 in a range of about 60 µm to about 100 µm. The recesses may be formed to provide an improved sidewall profile (e.g., more vertical), reduce chipping, and reduce delamination in subsequent singulation processes.

Figure 5A:
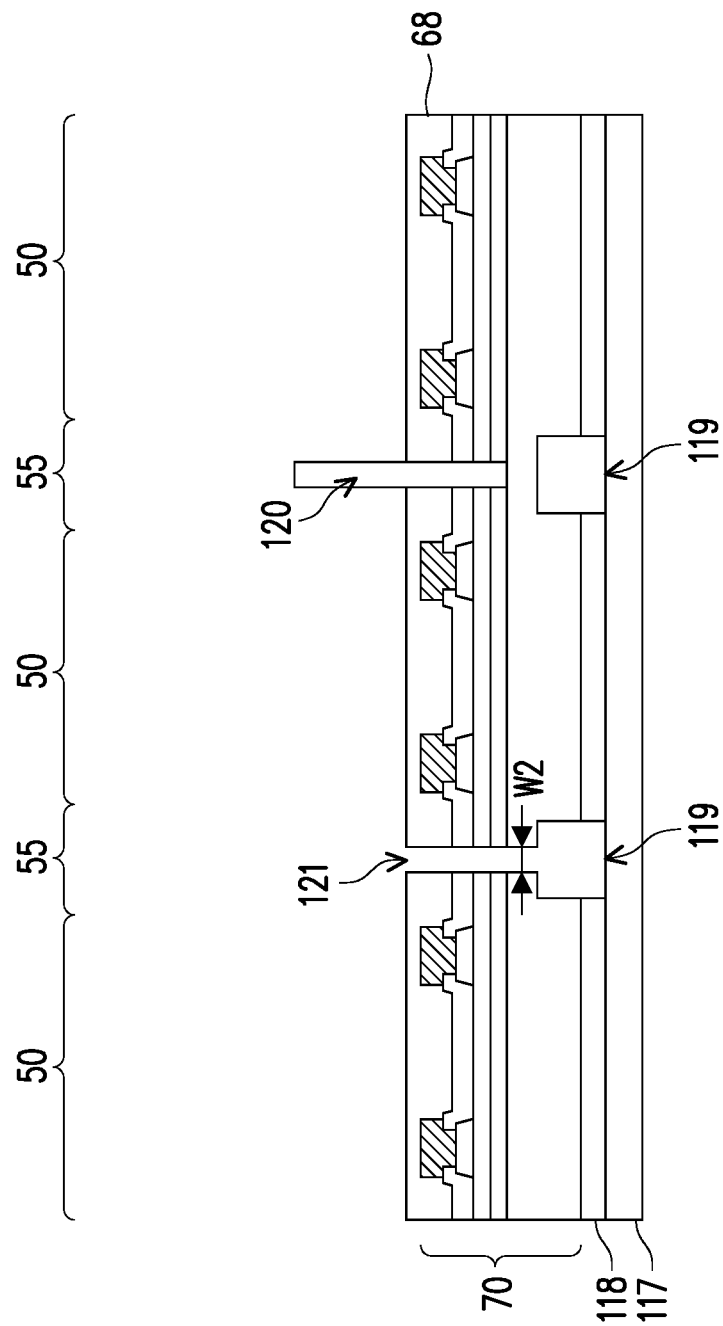

In FIGS. 5A, the package component 100 is then flipped over and placed on a frame 119. The carrier substrate 102, the bonding layer 104, and the bonding layer 105 may then be removed by grinding, etching (e.g., wet etching), CMP, combinations thereof, or the like to expose the dielectric layer 68 of the wafers 70.

The integrated circuit dies 50 are then singulated from the wafer 70. In some embodiments, singulation includes applying a blade 120 to the scribe line regions 55 to saw or cut through wafers 70 to the recesses 70. As a result, a kerf 121 is formed between adjacent integrated circuit dies 50, and the integrated circuit dies 50 are separated from each other. In some embodiments, the blade 120 is aligned with a center of the recesses 119, such that the kerfs 121 are symmetrical with the recesses 119. In other embodiments, 120 may be offset from centers of the recesses 119 such that kerfs are asymmetrical with the recesses 119. During sawing, a position of the blade 120 may shift in a lateral direction by about 5 µm or less, and the resulting kerfs 121 may have a width W2 in a range of about 40 µm to about 60 µm.

Figure 5B:
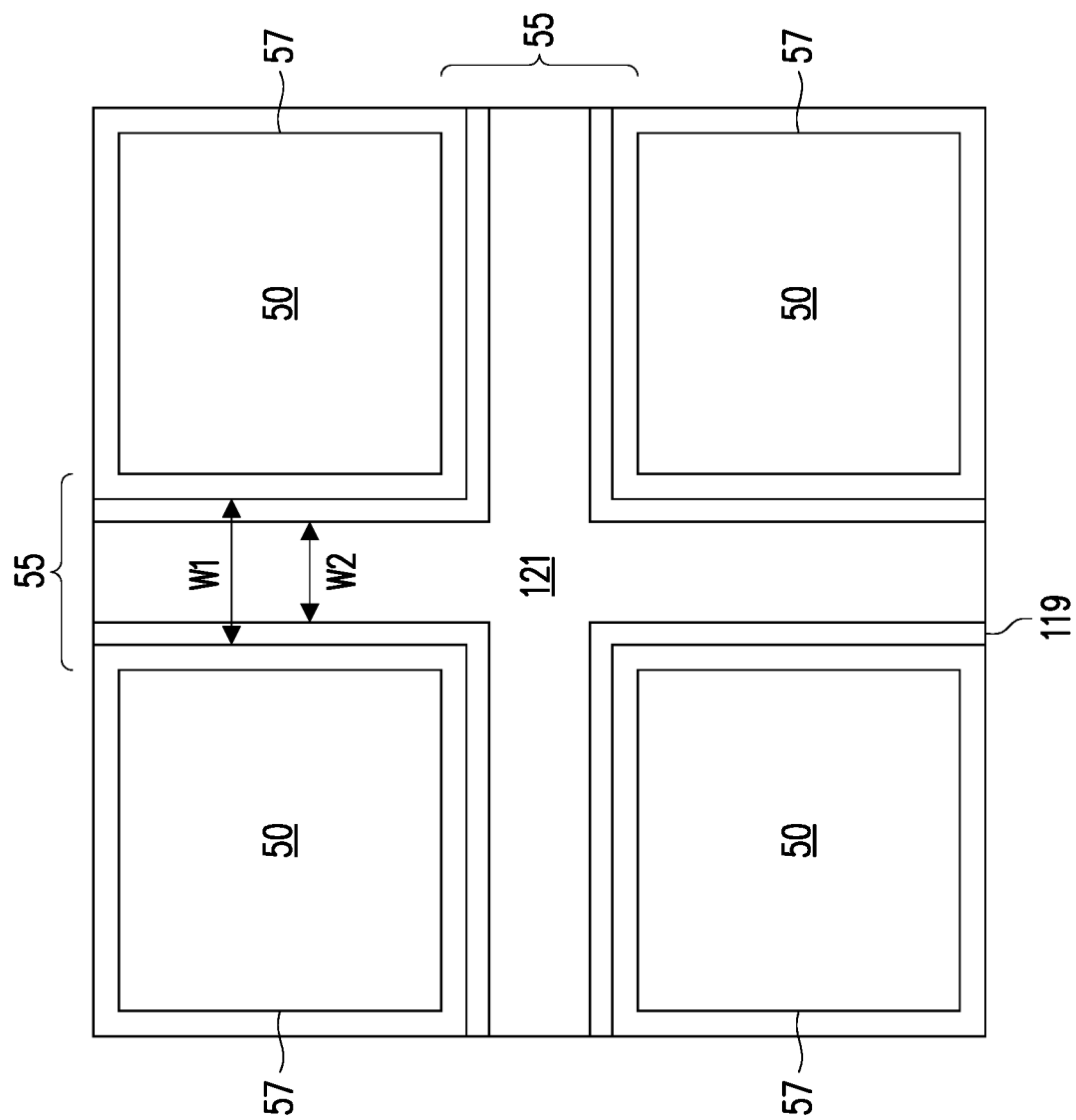

FIG. 5B illustrates a top down view of the wafer 70. As illustrated, each of the dies 50 are surrounded by a seal ring 57. The dies are separated by the scribe line regions 55. A width W2 of the kerfs 121 may be less than a width W1 of the recesses 119. Other configurations are also possible.

Figure 6A:
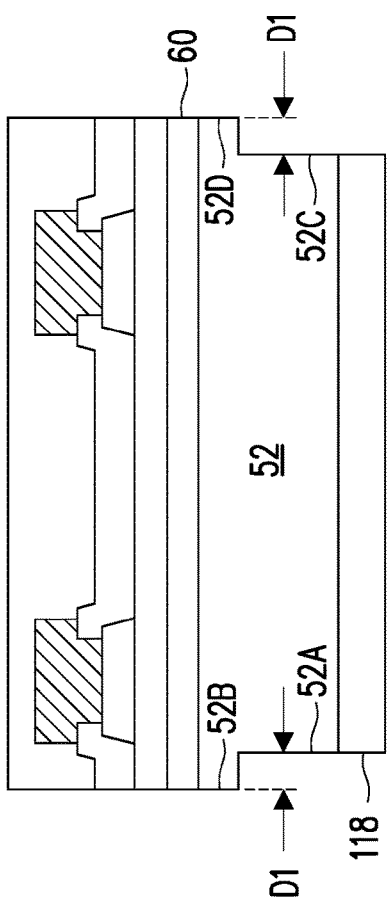
Figure 6B:
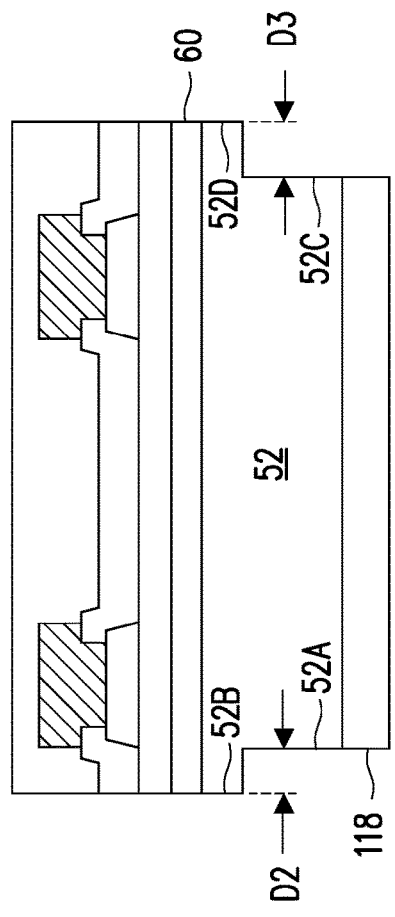
Figure 6C:
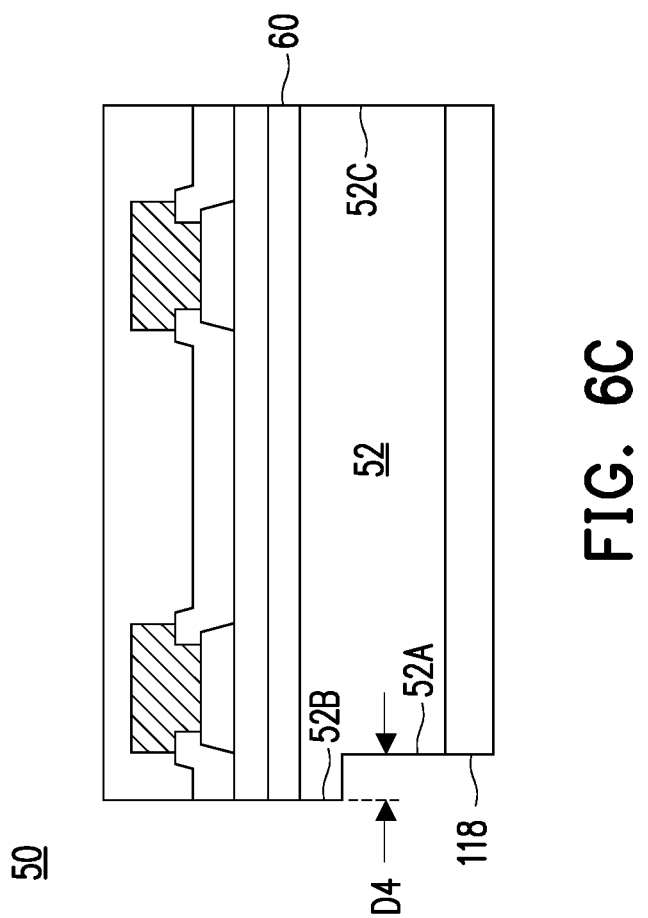

FIGS. 6A through 6C illustrate detailed views of the dies 50 after singulation according to some embodiments. FIG. 6A illustrates a die 50 resulting from a symmetrical singulation process where the blade 120 is aligned with centers of the recesses 119. In the resulting structure, the substrate 52 includes sidewalls 52A and 52C, which are offset from sidewalls 52B and 52D, respectively. Specifically, the sidewall 52A is offset from the sidewall 52B by a distance D1, and the sidewall 52C is offset from the sidewall 52D by the same distance D1. In some embodiments the distance D1 may in a range of about 5 µm to about 10 µm. Sidewalls of the bonding layer 118 are aligned with the sidewalls 52A and 52C.

FIGS. 6B and 6C illustrate a die 50 resulting from an asymmetrical singulation process where the blade 120 is offset from centers of the recesses 119. In the resulting structure of FIG. 6B, the sidewall 52A of the substrate 52 is offset from the sidewall 52B of the substrate 52 by a distance D2, and the sidewall 52C of the substrate 52 is offset from the sidewall 52D of the substrate 52 by a distance D3 different than the distance D2. Specifically, the distance D2 may be greater than or less than the distance D3. In such embodiments, each of the distances D2 and D3 may be in a range of about 5 µm to about 10 µm. In the structure of FIG. 6C, the substrate 52 includes a sidewall 52A that is offset from a sidewall 52B by a distance D4, which may be in a range of about 5 µm to about 10 µm. The substrate 52 further includes a sidewall 52C which extends linearly and continuously from the interconnect structure 60 to the bonding layer 118. Other configurations may also be possible. In both FIGS. 6B and 6C, sidewalls of the bonding layer 118 are aligned with the sidewalls 52A and 52C.

FIGS. 7 through 12C illustrate intermediate steps forming a semiconductor package 100 comprising the singulated, integrated circuit dies 50. A first package region 100A and a second package region 100B are illustrated, and one or more of the integrated circuit dies 50 are packaged to form an integrated circuit package in each of the package regions 100A and 100B. The integrated circuit packages may also be referred to as integrated fan-out (InFO) packages.

Figure 7:
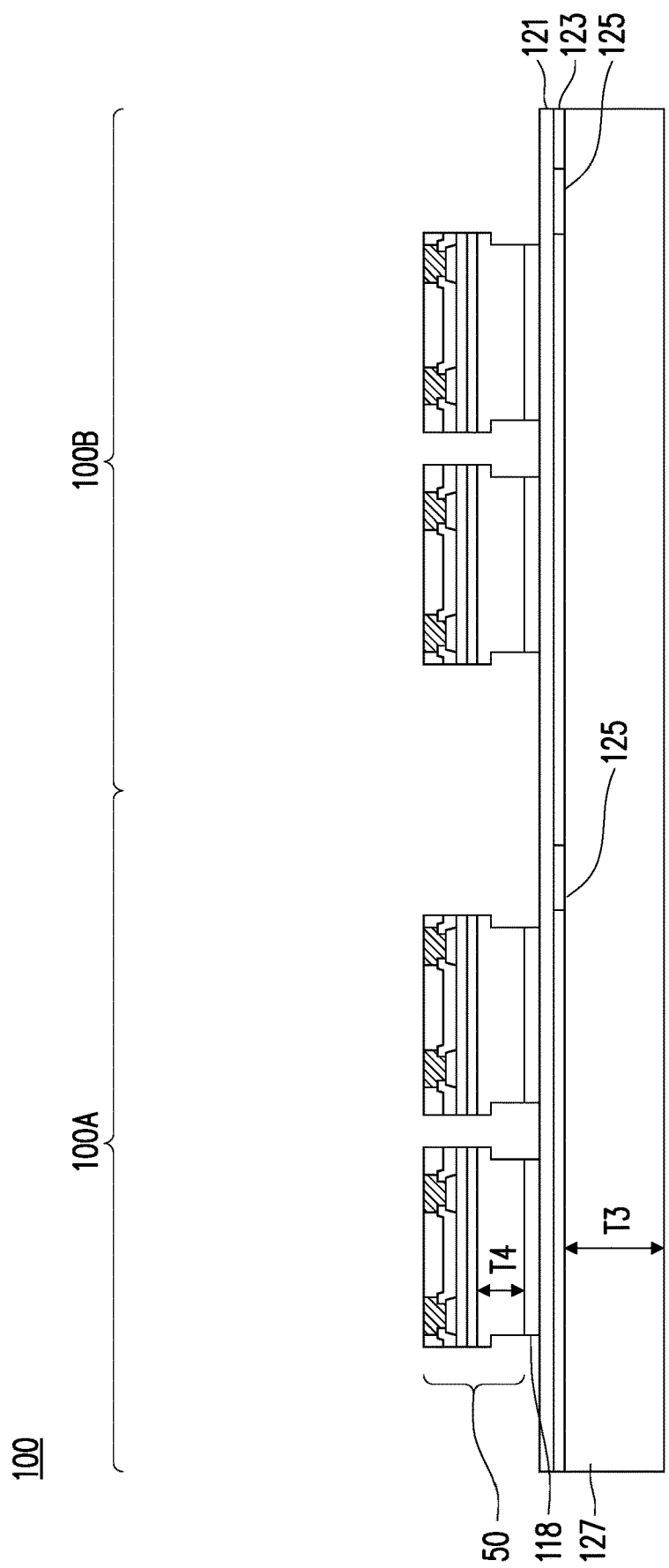

In FIG. 7, the singulated dies 50 are attached to a bulk semiconductor substrate 127 in each of the package regions 100A and 100B. Although two dies 50 are illustrated as being attached in each of the package regions 100A and 100B, a greater or fewer number of dies 50 may be attached in each package region in other embodiments. The semiconductor substrate 127 may comprise a semiconductor material such as silicon or the like. The semiconductor substrate 127 may be free of any active or passive devices in some embodiments. A dielectric layer 123 is formed on the semiconductor substrate 127, and an alignment mark 125 may be disposed in the dielectric layer 123. In some embodiments, the dielectric layer 123 may comprise silicon oxide, silicon nitride, silicon oxynitride, a polymer, or the like and be deposited by PVD, CVD, ALD, or the like. Further, the alignment mark 125 may comprise a conductive material, which is formed in the dielectric layer 123 by a damascene process for example. Other materials and formation methods are also possible. The alignment mark 125 may facilitate accurate placement of the dies 50 on the semiconductor substrate 127 in each of the package regions 100A and 100B.

A bonding layer 121 is deposited over the dielectric layer 123 and the alignment mark 125. In some embodiments, the bonding layer 121 may comprise a similar material and be formed of a similar process as described above with respect to the bonding layer 104. The dies 50 may be bonded to the bonding layer 121 using the bonding layer 118. For example, the bonding layers 118 and 121 may be directly bonded with oxide-to-oxide bonds using a similar process as described above with respect to bonding the bonding layers 104 and 105.

In various embodiments, the addition of the semiconductor substrate 127 allows for enhanced thermal dissipation from the dies 50. The material of the semiconductor substrates 52 and 127 (e.g., silicon) may have relatively high thermal dissipation properties, and increasing the volume of the material with the addition of the semiconductor substrate 127 may improve thermal dissipation in the resulting package. In some embodiments, the semiconductor substrate 127 has a thickness T3 in a range of about 70 µm to about 270 µm, and a ratio between the thicknesses T3 of the semiconductor substrate to a thickness T4 of the substrates 52 may be in a range of about 0.5 to about 2 such as in a range of about 1 to about 2. It has been observed that by adding a semiconductor substrate 127 in the above ranges, thermal dissipation in the resulting package may be sufficiently improved.

Figure 8:
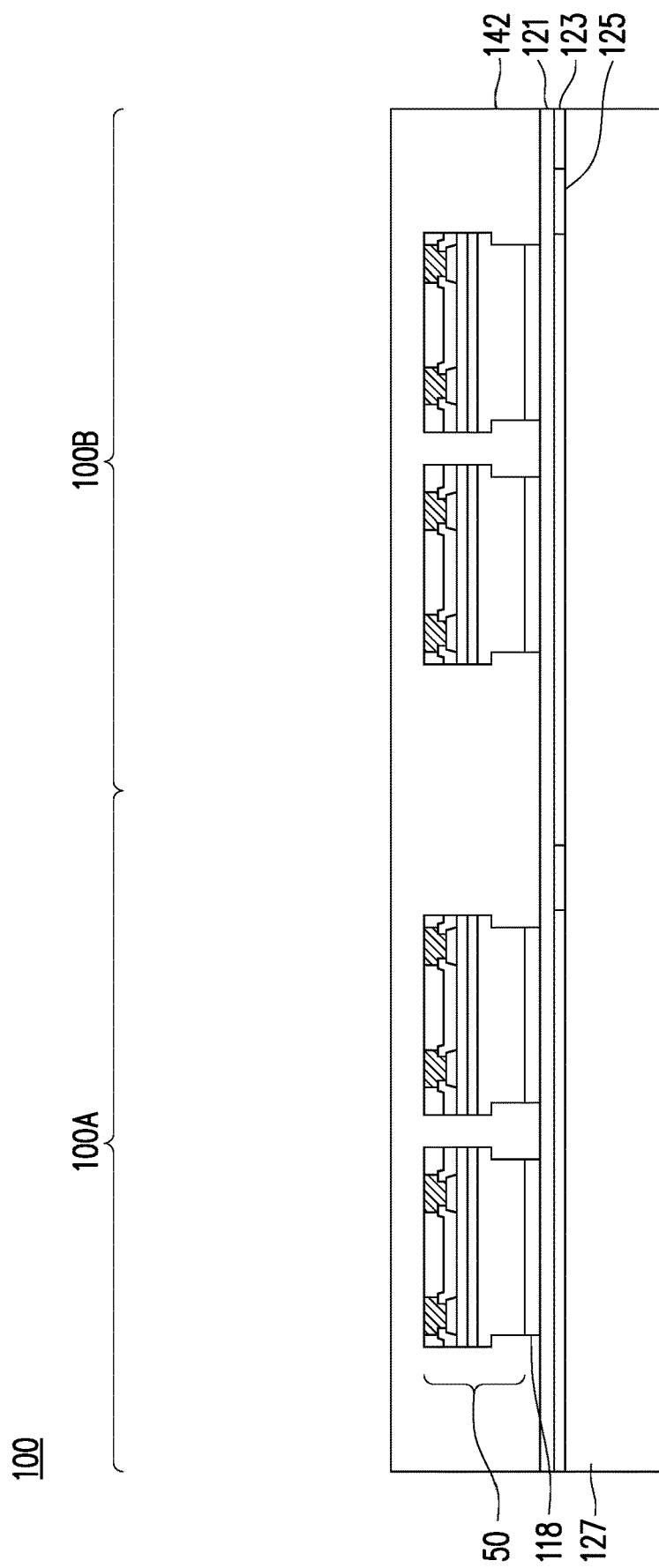

In FIG. 8, an encapsulant 142 is formed around the integrated circuit dies 50 and over the semiconductor substrate 127. After formation, the encapsulant 142 encapsulates the integrated circuit dies 50. The encapsulant 142 may be a molding compound, epoxy, or the like. The encapsulant 142 may be applied by compression molding, transfer molding, or the like, and may be formed over the carrier substrate 102 such that the integrated circuit dies 50 are buried or covered. The encapsulant 142 is further formed in gap regions between the integrated circuit dies 50. The encapsulant 142 may be applied in liquid or semi-liquid form and then subsequently cured. Because the encapsulant 142 is not dispensed around the semiconductor substrate 127, a volume of the encapsulant 142 in the resulting packages is not increased even with the increased volume of thermally conductive, semiconductor material. Accordingly, warpage control in the resulting package is maintained at an acceptable level.

Figure 9:
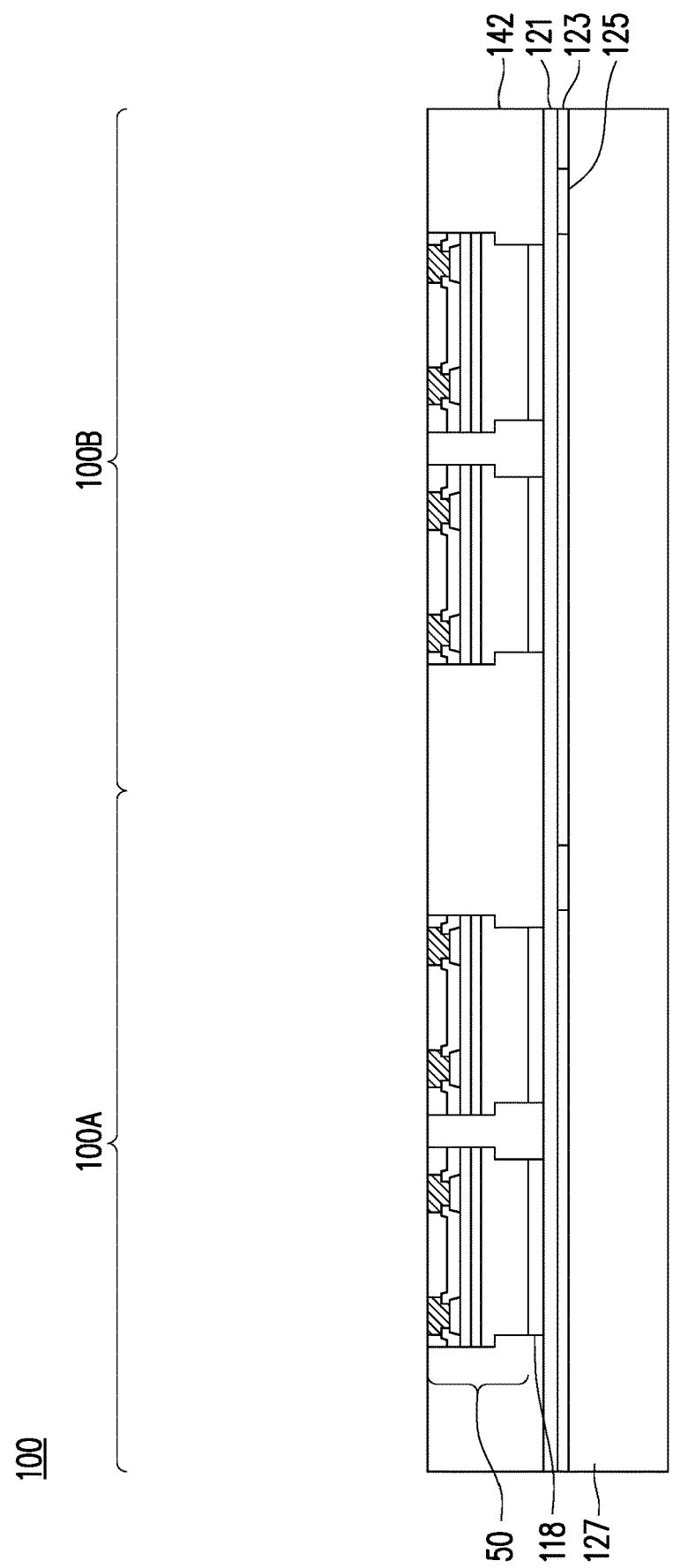

In FIG. 9, a planarization process is performed on the encapsulant 142 to expose die connectors 66. The planarization process may also remove material of dielectric layer 68, and/or die connectors 66 until the die connectors 66 are exposed. Top surfaces of the die connectors 66, dielectric layer 68, and encapsulant 142 are substantially coplanar after the planarization process within process variations. The planarization process may be, for example, a chemical-mechanical polish (CMP), a grinding process, or the like. In some embodiments, the planarization may be omitted, for example, if the die connectors 66 are already exposed.

Figure 10:
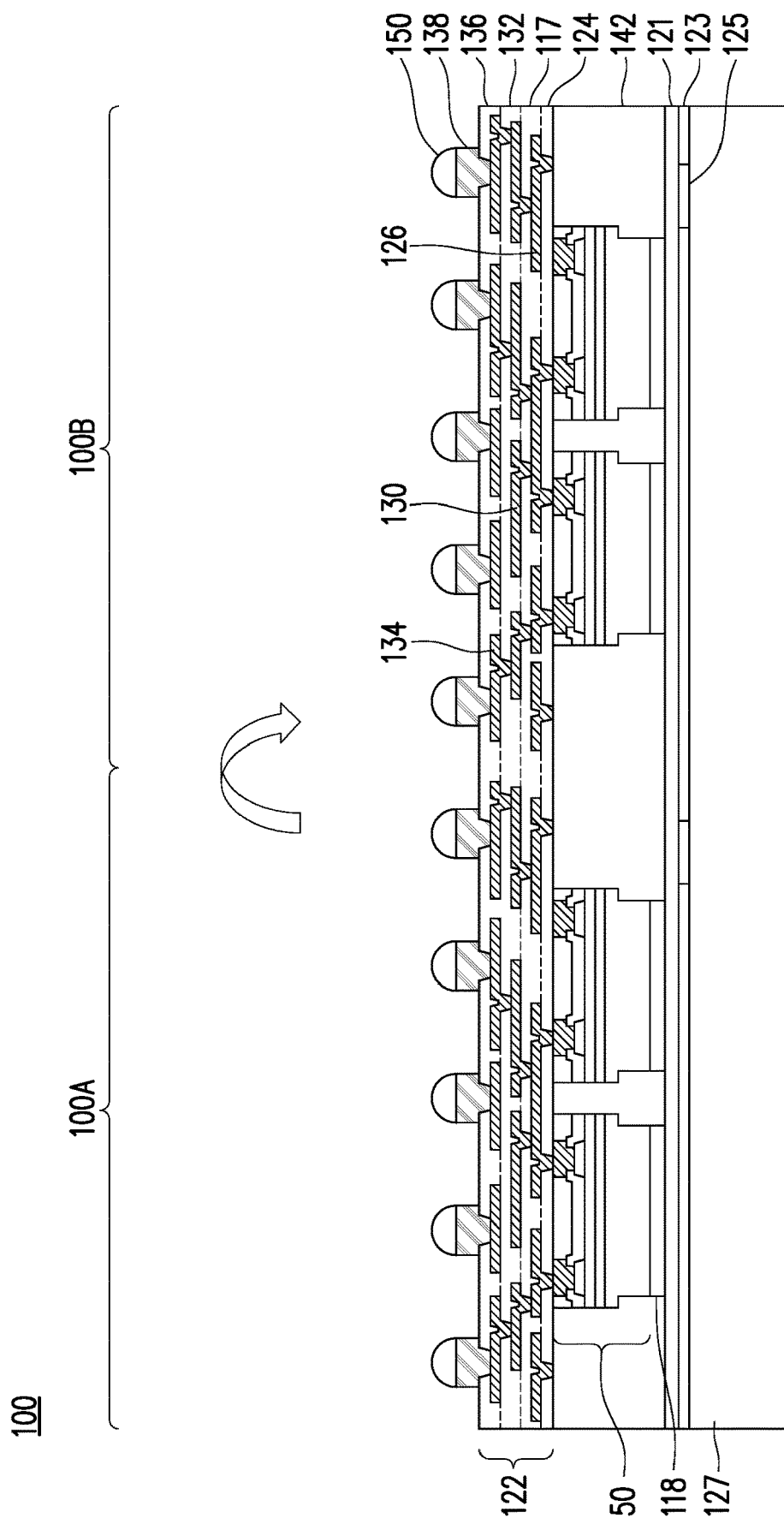

In FIG. 10, a front-side redistribution structure 122 is formed over the encapsulant 142 and integrated circuit dies 50. The front-side redistribution structure 122 includes dielectric layers 124, 128, 132, and 136; and metallization patterns 126, 130, and 134. The metallization patterns may also be referred to as redistribution layers or redistribution lines. The front-side redistribution structure 122 is shown as an example having three layers of metallization patterns. More or fewer dielectric layers and metallization patterns may be formed in the front-side redistribution structure 122. If fewer dielectric layers and metallization patterns are to be formed, steps and process discussed below may be omitted. If more dielectric layers and metallization patterns are to be formed, steps and processes discussed below may be repeated.

As an example of forming the redistribution structure 122, the dielectric layer 124 is deposited on the encapsulant 142 and die connectors 66. In some embodiments, the dielectric layer 124 is formed of a photo-sensitive material such as PBO, polyimide, BCB, or the like, which may be patterned using a lithography mask. The dielectric layer 124 may be formed by spin coating, lamination, CVD, the like, or a combination thereof. The dielectric layer 124 is then patterned. The patterning forms openings exposing portions of the through vias 116 and the die connectors 66. The patterning may be by an acceptable process, such as by exposing and developing the dielectric layer 124 to light when the dielectric layer 124 is a photo-sensitive material or by etching using, for example, an anisotropic etch.

The metallization pattern 126 is then formed. The metallization pattern 126 includes conductive elements extending along the major surface of the dielectric layer 124 and extending through the dielectric layer 124 to physically and electrically couple to the integrated circuit dies 50. As an example to form the metallization pattern 126, a seed layer is formed over the dielectric layer 124 and in the openings extending through the dielectric layer 124. In some embodiments, the seed layer is a metal layer, which may be a single layer or a composite layer comprising a plurality of sublayers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 126. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 126. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 128 is deposited on the metallization pattern 126 and dielectric layer 124. The dielectric layer 128 may be formed in a manner similar to the dielectric layer 124, and may be formed of a similar material as the dielectric layer 124.

The metallization pattern 130 is then formed. The metallization pattern 130 includes portions on and extending along the major surface of the dielectric layer 128. The metallization pattern 130 further includes portions extending through the dielectric layer 128 to physically and electrically couple the metallization pattern 126. The metallization pattern 130 may be formed in a similar manner and of a similar material as the metallization pattern 126. In some embodiments, the metallization pattern 130 has a different size than the metallization pattern 126. For example, the conductive lines and/or vias of the metallization pattern 130 may be wider or thicker than the conductive lines and/or vias of the metallization pattern 126. Further, the metallization pattern 130 may be formed to a greater pitch than the metallization pattern 126.

The dielectric layer 132 is deposited on the metallization pattern 130 and dielectric layer 128. The dielectric layer 132 may be formed in a manner similar to the dielectric layer 124, and may be formed of a similar material as the dielectric layer 124.

The metallization pattern 134 is then formed. The metallization pattern 134 includes portions on and extending along the major surface of the dielectric layer 132. The metallization pattern 134 further includes portions extending through the dielectric layer 132 to physically and electrically couple the metallization pattern 130. The metallization pattern 134 may be formed in a similar manner and of a similar material as the metallization pattern 126. The metallization pattern 134 may be the topmost metallization pattern of the front-side redistribution structure 122. As such, all of the intermediate metallization patterns of the front-side redistribution structure 122 (e.g., the metallization patterns 126 and 130) are disposed between the metallization pattern 134 and the integrated circuit dies 50 in some embodiments. In some embodiments, the metallization pattern 134 has a different size than the metallization patterns 126 and 130. For example, the conductive lines and/or vias of the metallization pattern 134 may be wider or thicker than the conductive lines and/or vias of the metallization patterns 126 and 130. Further, the metallization pattern 134 may be formed to a greater pitch than the metallization pattern 130.

The dielectric layer 136 is deposited on the metallization pattern 134 and dielectric layer 132. The dielectric layer 136 may be formed in a manner similar to the dielectric layer 124, and may be formed of the same material as the dielectric layer 124. The dielectric layer 136 may be the topmost dielectric layer of the front-side redistribution structure 122. As such, all of the metallization patterns of the front-side redistribution structure 122 (e.g., the metallization patterns 126, 130, and 134) are disposed between the dielectric layer 136 and the integrated circuit dies 50A and 50B in some embodiments. Further, all of the intermediate dielectric layers of the front-side redistribution structure 122 (e.g., the dielectric layers 124, 128, 132) are disposed between the dielectric layer 136 and the integrated circuit dies 50.

UBMs 138 are formed for external connection to the front-side redistribution structure 122. The UBMs 138 have bump portions on and extending along the major surface of the dielectric layer 136, and have via portions extending through the dielectric layer 136 to physically and electrically couple the metallization pattern 134. As a result, the UBMs 138 are electrically coupled to the integrated circuit dies 50. The UBMs 138 may be formed of the same material as the metallization pattern 126. In some embodiments, the UBMs 138 has a different size than the metallization patterns 126, 130, and 134.

Conductive connectors 150 are formed on the UBMs 138. The conductive connectors 150 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 150 may include a conductive material such as solder, copper, aluminum, gold, nickel, silver, palladium, tin, the like, or a combination thereof. In some embodiments, the conductive connectors 150 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 150 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 11:
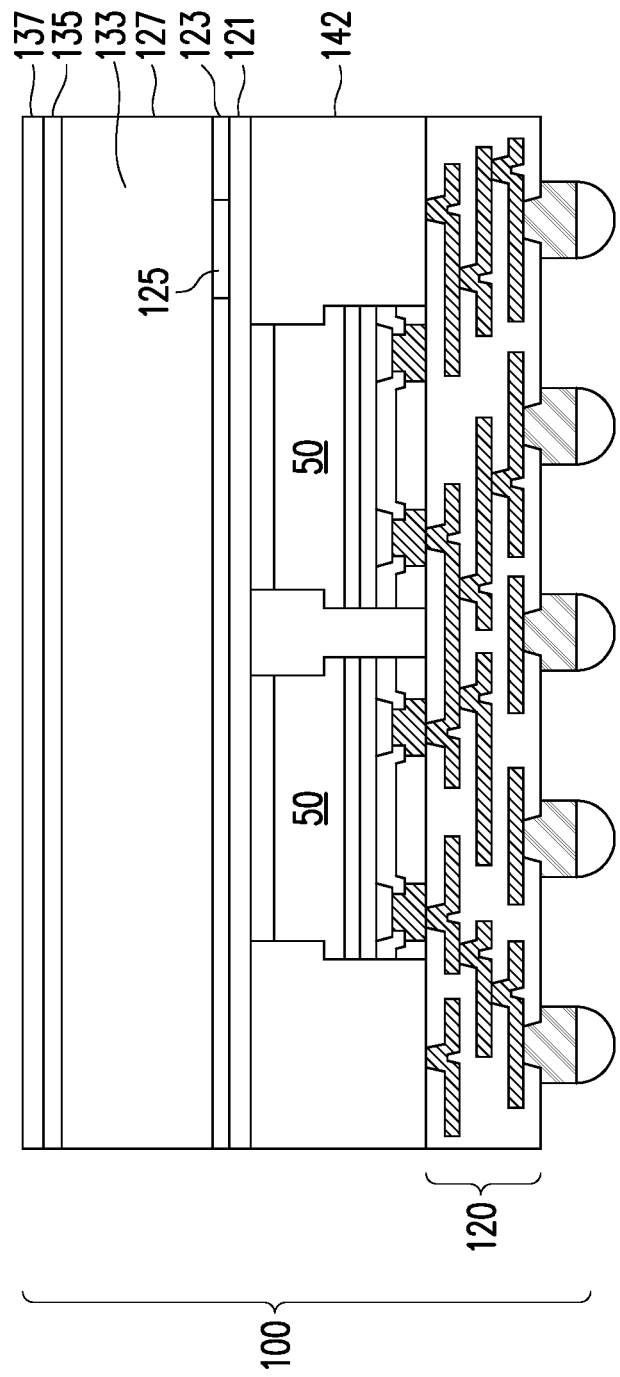

In FIG. 11, a singulation process may be applied to separate the packages 100 in each of the package regions 100A and 100B. An orientation of the packages 100 may be flipped, and the packages 100 may be attached to a tape (not shown). Further, one or more passivation layers may be optionally deposited on a surface the semiconductor substrate 127 opposite the integrated circuit dies 50 and the redistribution structure 122. For example, a die attach film (DAF) 135 and a dielectric layer 137 may be formed on exposed surfaces of the semiconductor substrate 127. The dielectric layer 137 may comprise silicon nitride, silicon oxynitride, a polymer material (e.g., polybenzoxazole (PBO), polyimide), or the like. The DAF 135 and the dielectric layer 137 may be deposited by CVD, PVD, ALD, combinations thereof, or the like. The DAF 135 and the dielectric layer 137 may be used to protect and reduce oxidation on the exposed surfaces of the semiconductor substrate 127. The DAF 135 and the dielectric layer 137 are optional, and the DAF 135 and/or the dielectric layer 137 may be omitted in other embodiments.

Figure 12A:
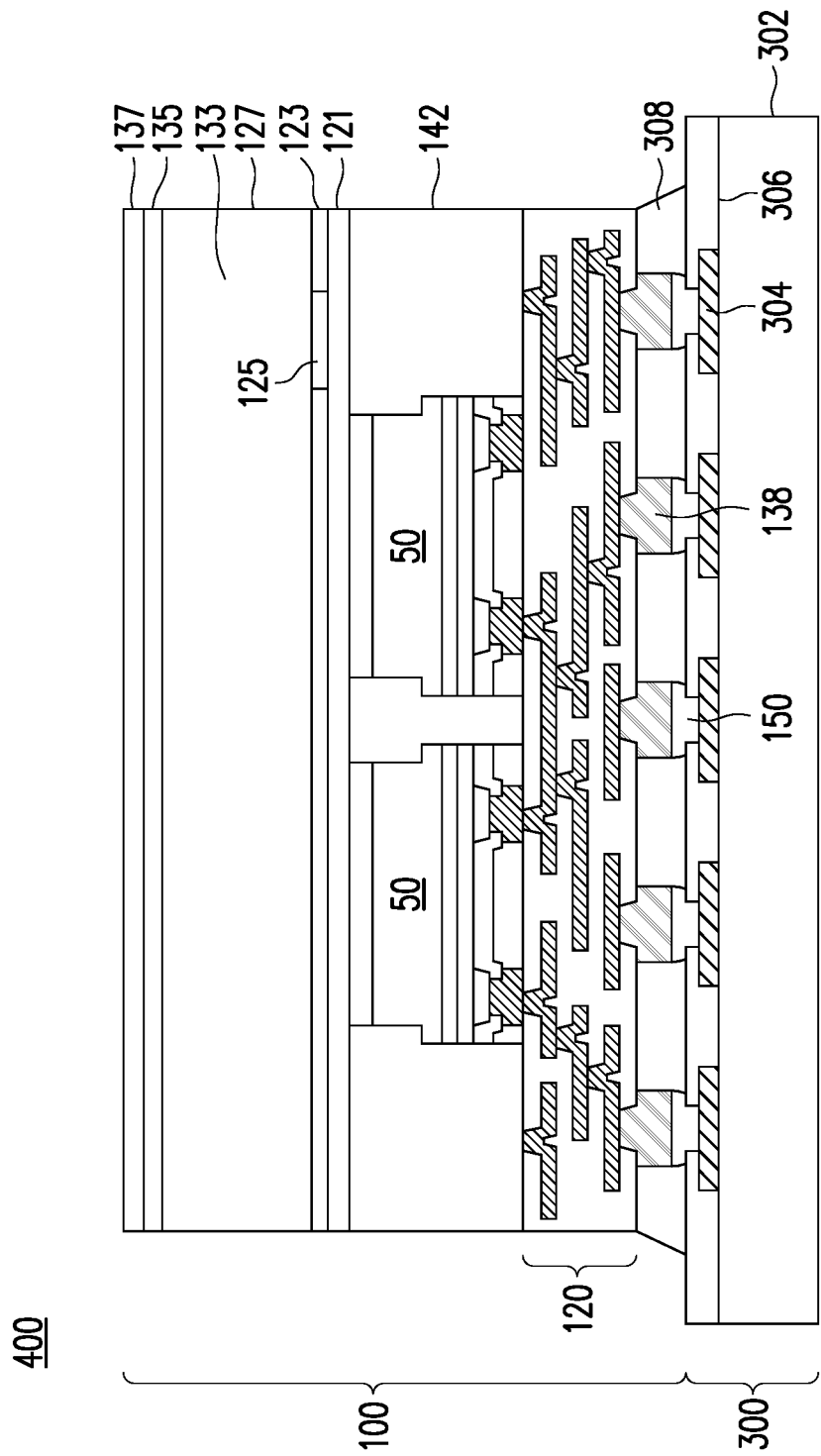

In FIG. 12A, each singulated first package component 100 may then be mounted to a package substrate 300 using the conductive connectors 150. The package substrate 300 includes a substrate core 302 and bond pads 304 over the substrate core 302. The substrate core 302 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 302 may be a SOI substrate. Generally, an SOI substrate includes a layer of a semiconductor material such as epitaxial silicon, germanium, silicon germanium, SOI, SGOI, or combinations thereof. The substrate core 302 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 302.

The substrate core 302 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 302 may also include metallization layers and vias (not shown), with the bond pads 304 being physically and/or electrically coupled to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate core 302 is substantially free of active and passive devices.

In some embodiments, the conductive connectors 150 are reflowed to attach the first package component 100 to the bond pads 304. The conductive connectors 150 electrically and/or physically couple the package substrate 300, including metallization layers in the substrate core 302, to the first package component 100. In some embodiments, a solder resist 306 is formed on the substrate core 302. The conductive connectors 150 may be disposed in openings in the solder resist 306 to be electrically and mechanically coupled to the bond pads 304. The solder resist 306 may be used to protect areas of the substrate 302 from external damage.

The conductive connectors 150 may have an epoxy flux (not shown) formed thereon before they are reflowed with at least some of the epoxy portion of the epoxy flux remaining after the first package component 100 is attached to the package substrate 300. This remaining epoxy portion may act as an underfill to reduce stress and protect the joints resulting from the reflowing the conductive connectors 150. In some embodiments, an underfill 308 may be formed between the first package component 100 and the package substrate 300 and surrounding the conductive connectors 150. The underfill 308 may be formed by a capillary flow process after the first package component 100 is attached or may be formed by a suitable deposition method before the first package component 100 is attached.

In some embodiments, passive devices (e.g., surface mount devices (SMDs), not shown) may also be attached to the first package component 100 (e.g., to the UBMs 138) or to the package substrate 300 (e.g., to the bond pads 304). For example, the passive devices may be bonded to a same surface of the first package component 100 or the package substrate 300 as the conductive connectors 150. The passive devices may be attached to the package component 100 prior to mounting the first package component 100 on the package substrate 300, or may be attached to the package substrate 300 prior to or after mounting the first package component 100 on the package substrate 300.

Thus, a semiconductor package 400 is manufactured. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 12B:
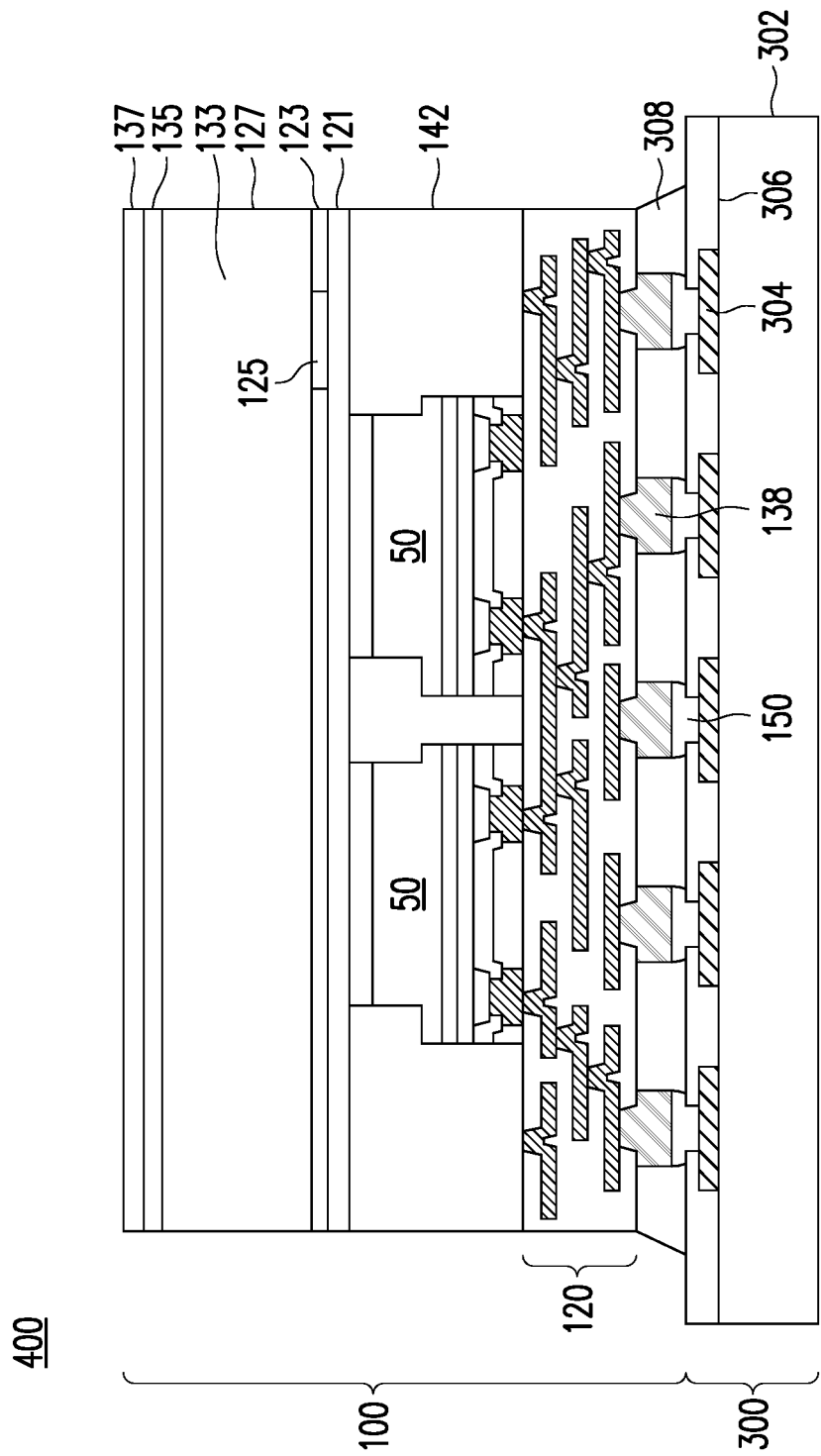
Figure 12C:
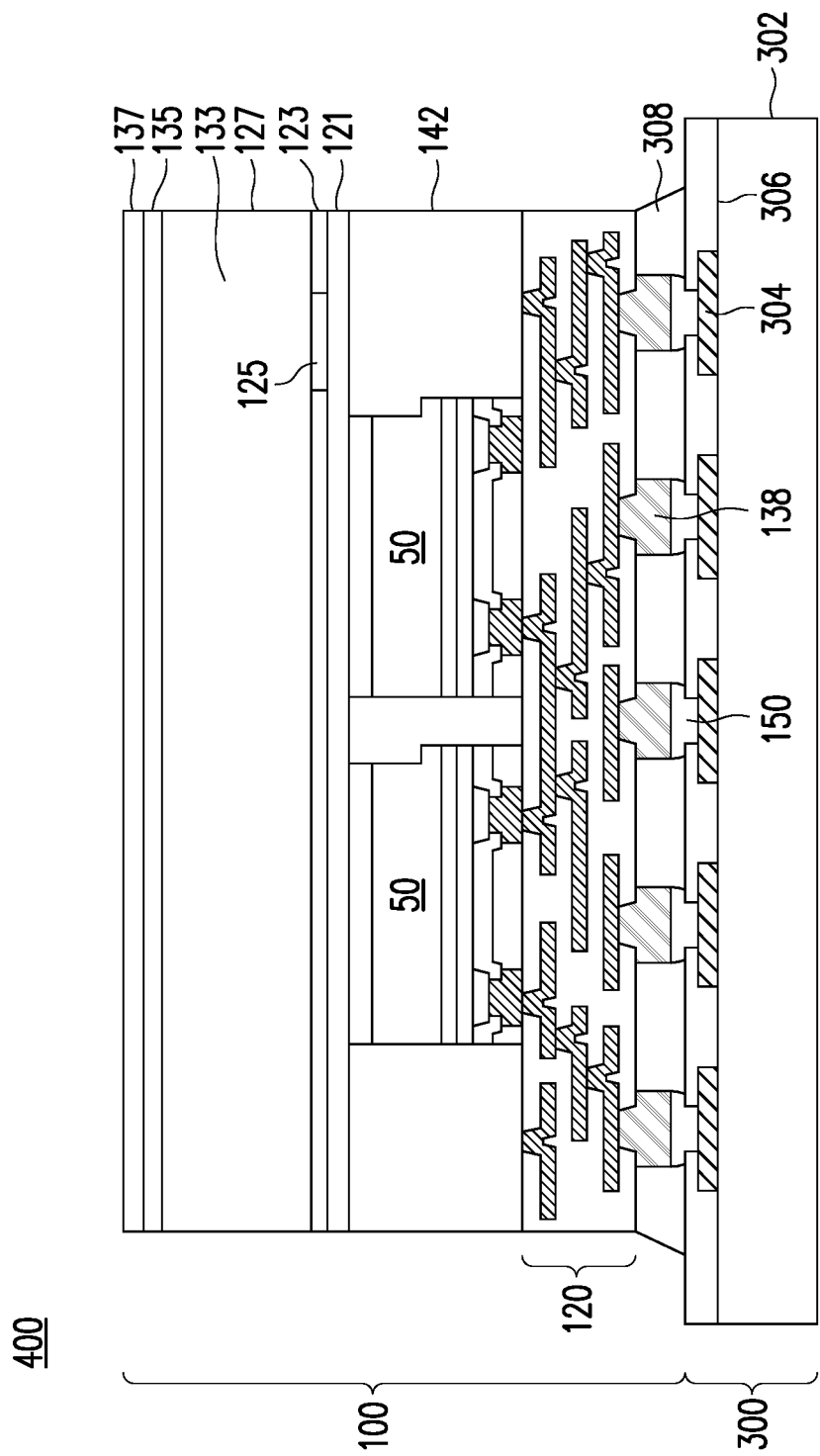

FIG. 12A illustrates an embodiment comprising dies 50, which correspond to the configuration of FIG. 6A where a symmetrical singulation process is applied to the wafer 70. Other embodiments may include dies that are singulated with an asymmetrical singulation process. For example, FIGS. 12B and 12C illustrate alternate embodiments where like reference numerals indicate like elements formed by liked processes as the embodiments of FIG. 12A. However, the dies 50 in FIGS. 12B and 12C may correspond to the configurations of FIGS. 6B and 6C, respectively, that are singulated from the wafer 70 with asymmetrical singulation processes.

Figure 13:
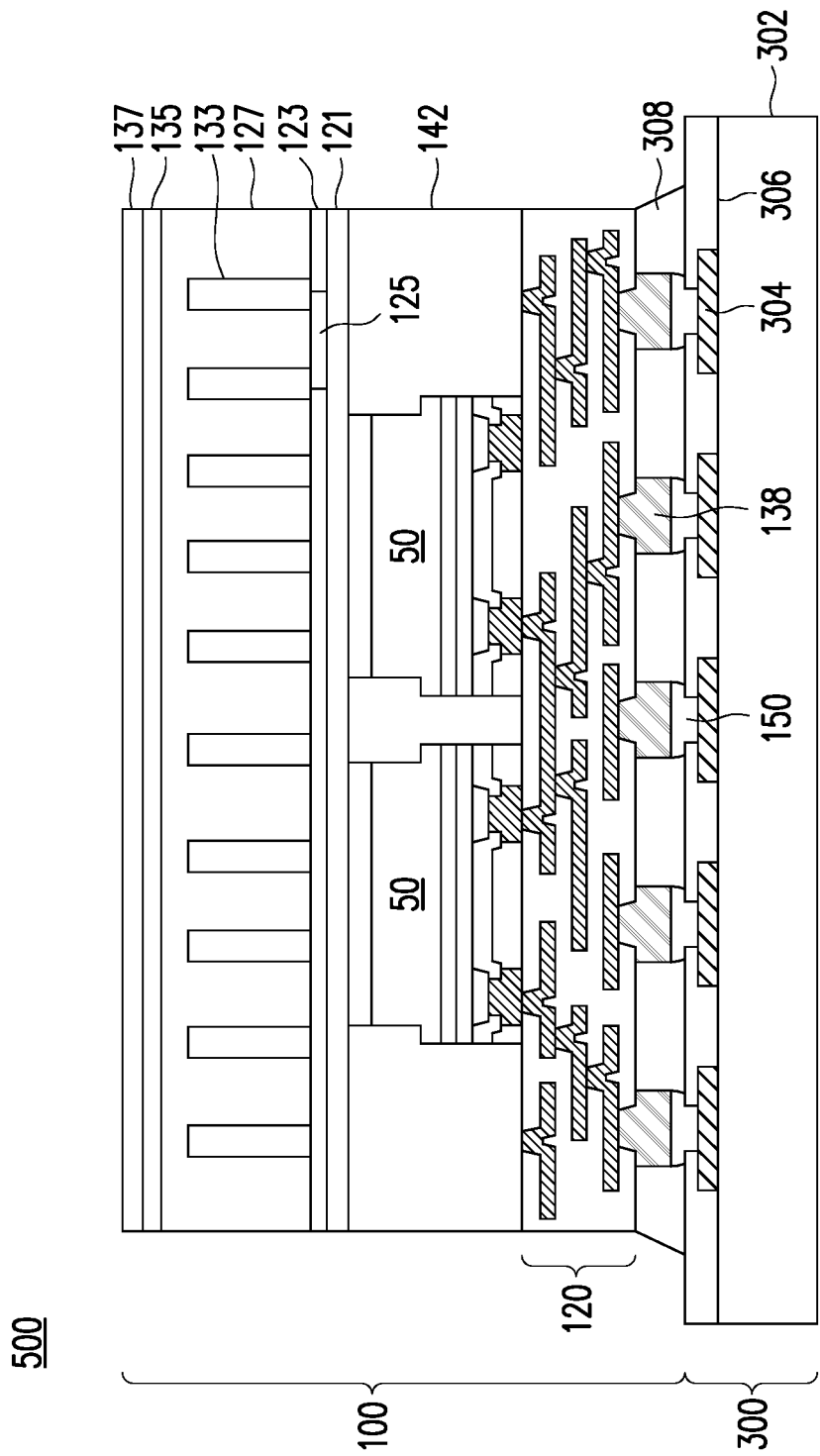
FIGS. 13, 14A, and 14B illustrate cross-sectional views of formation and implementation of device stacks in accordance with some embodiments.
Figure 14A:
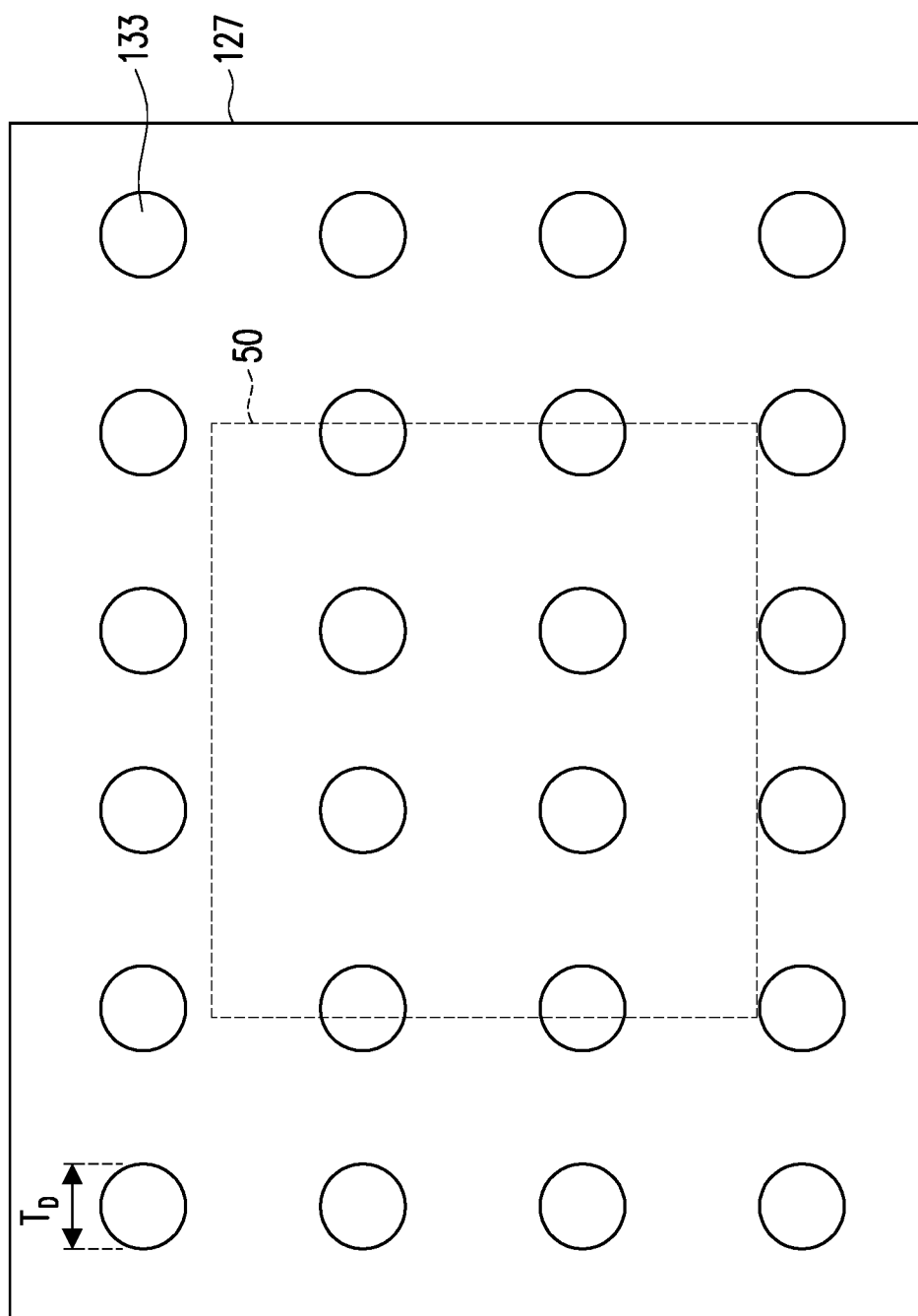
Figure 14B:
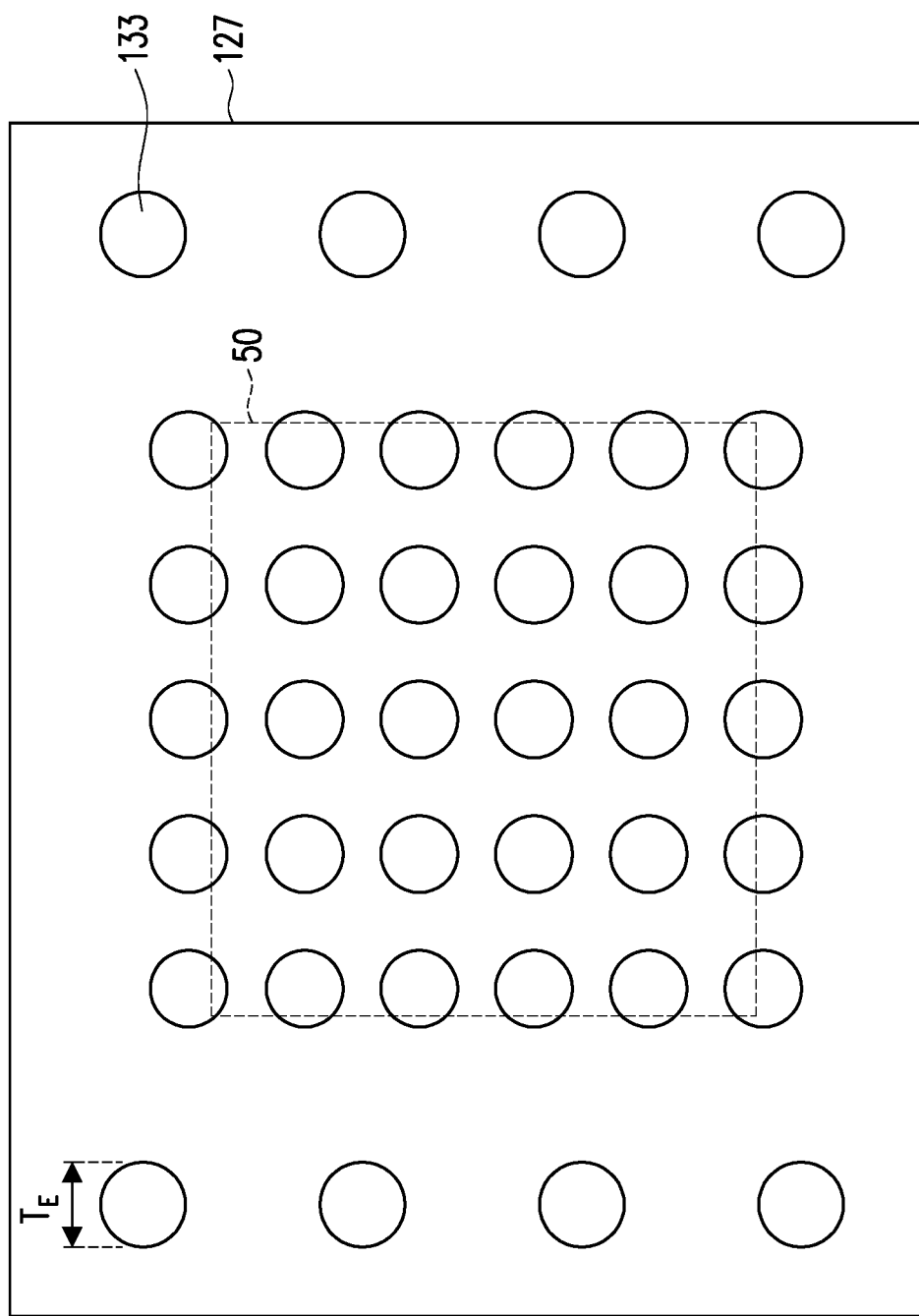

FIGS. 13, 14A, and 14B illustrate varying views of a semiconductor package 500 according to some alternate embodiments. The semiconductor package 500 may be similar to the semiconductor package 400 where like reference numerals indicate like elements formed by like processes. However, the semiconductor substrate 127 of the package 500 further includes conductive vias 133, which extend at least partially through the semiconductor substrate 127. In some embodiments, the conductive vias 133 are disposed at a surface of the semiconductor substrate that faces the integrated circuit dies 50. The conductive vias 133 may comprise a metal, such as copper, and be formed by a damascene process, for example. The inclusion of the conductive vias 133 in the semiconductor substrate 127 may further increase the thermal conductivity of the semiconductor substrate 127, thereby improving thermal dissipation. FIG. 13 illustrates embodiment integrated circuit dies that are singulated with a symmetrical singulation process (e.g., as described with FIG. 6A), but it should be appreciated that the package configuration of FIG. 13 may also be adapted to dies that are singulated with an asymmetrical singulation process (e.g., as described with FIGS. 6B and 6C).

FIGS. 14A and 14B illustrate top-down views of the conductive vias 133 in the semiconductor substrate 127. A position of a die 50 is shown in ghost for reference. Each of the conductive vias 133 may have a diameter $T_D$, which may be in a range of about 5 μm to about 12 μm. In some embodiments (as illustrated by FIG. 14A), the conductive vias 133 are uniformly distributed across the semiconductor substrate 127. In other embodiments (as illustrated by FIG. 14B), a density of the conductive vias 133 is concentrated in a region of the semiconductor substrate 127 that overlaps the dies 50. For example, a density of the conductive vias 133 may be higher in a region that overlaps the dies 50 than outside of the region that overlaps the dies 50. By concentrating the conductive vias 133 in a region with relatively high thermal activity (e.g., overlapping the dies 50), thermal dissipation may be further improved.

Embodiments may achieve advantages. In various embodiments, a semiconductor package includes a molded die that is bonded to a bulk semiconductor substrate, such as a bulk silicon substrate or the like. The semiconductor substrate can increase the volume of semiconductor material in the package to improve thermal dissipation. Further, the semiconductor substrate is not encapsulated in the molding compound, and the inclusion of the semiconductor substrate does not significantly increasing the volume of the molding compound in the semiconductor package. As a result, defects associated with increased molding compound volume, such as poor warpage control or the like, can be avoided. Optionally, conductive vias may be included in the semiconductor substrate to further improve thermal dissipation.

In some embodiments, a method includes bonding an integrated circuit die to a first semiconductor substrate, wherein the first semiconductor substrate is free of active devices; dispensing a molding compound over the first semiconductor substrate and around the integrated circuit die; and forming a redistribution structure over the molding compound and the integrated circuit die, wherein the redistribution structure is electrically connected to the integrated circuit die. Optionally, in some embodiments, the integrated circuit die comprises a second semiconductor substrate, and wherein a ratio of a first thickness of the first semiconductor substrate to a second thickness of the second semiconductor substrate is in a range of 0.5 to 2. Optionally, in some embodiments, the integrated circuit die comprises a second semiconductor substrate, and wherein a ratio of a first thickness of the first semiconductor substrate to a second thickness of the second semiconductor substrate is in a range of 1 to 2. Optionally, in some embodiments, bonding the integrated circuit die to the first semiconductor substrate comprises directly bonding a first dielectric layer on the first semiconductor substrate to a second dielectric layer on a second semiconductor substrate of the integrated circuit die. Optionally, in some embodiments, the method further includes forming a third dielectric layer on the first semiconductor substrate; forming an alignment mark in the third dielectric layer; and forming the first dielectric layer on the third dielectric layer and the alignment mark. Optionally, in some embodiments, the first semiconductor substrate comprises a plurality of conductive vias. Optionally, in some embodiments, the method further includes singulating the integrated circuit die from a wafer. Optionally, in some embodiments, singulating the integrated circuit die from the wafer comprises: patterning a recess in a second semiconductor substrate of the wafer; and after patterning the recess, applying a blade to cut through a remainder of the wafer to the recess. Optionally, in some embodiments, applying the blade comprises aligning the blade to a center of the recess. Optionally, in some embodiments, applying the blade comprises aligning the blade to be offset from a center of the recess.

In some embodiments, a package includes a first semiconductor substrate; an integrated circuit die bonded to the first semiconductor substrate with a dielectric-to-dielectric bond, wherein the integrated circuit die comprises a second semiconductor substrate, and wherein the second semiconductor substrate comprises a first sidewall, a second sidewall, and a third sidewall opposite the first sidewall and the second sidewall, and wherein the second sidewall is offset from the first sidewall; a molding compound over the first semiconductor substrate and around the integrated circuit die; and a redistribution structure over the first semiconductor substrate and the integrated circuit die, wherein the redistribution structure is electrically connected to the integrated circuit die. Optionally, in some embodiments, the second semiconductor substrate further comprises a fourth sidewall opposite the first sidewall and the second sidewall, and wherein the fourth sidewall is offset from the third sidewall. Optionally, in some embodiments, a first distance that the first sidewall is offset from the second sidewall is equal to a second distance that the fourth sidewall is offset from the third sidewall. Optionally, in some embodiments, a first distance that the first sidewall is offset from the second sidewall is greater than a second distance that the fourth sidewall is offset from the third sidewall. Optionally, in some embodiments, the third sidewall is linear and extends continuously from a topmost surface of the second semiconductor substrate to a bottommost surface of the second semiconductor substrate. Optionally, in some embodiments, the package further includes a plurality of conductive vias in the first semiconductor substrate.

In some embodiments, a package includes a bulk substrate; an device die bonded to the bulk substrate, wherein the device die comprises a semiconductor substrate, and wherein a ratio of a thickness of the bulk substrate to a thickness of the semiconductor substrate is in a range of 0.5 to 2; a molding compound over the bulk substrate, wherein the molding compound encapsulates the device die without encapsulating the bulk substrate; and a redistribution layer on an opposing side of the device die as the bulk substrate. Optionally, in some embodiments, the bulk substrate further comprises a plurality of through vias. Optionally, in some embodiments, the plurality of through vias has a uniform distribution across the bulk substrate. Optionally, in some embodiments, the plurality of through vias has a high density in a first region of the bulk substrate compared to a second region of the bulk substrate, and wherein the first region of the bulk substrate overlaps the device die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a first semiconductor substrate;
an integrated circuit die bonded to the first semiconductor substrate with a dielectric-to-dielectric bond, wherein the integrated circuit die comprises a second semiconductor substrate, and wherein the second semiconductor substrate comprises a first sidewall, a second sidewall, and a third sidewall opposite the first sidewall and the second sidewall, and wherein the second sidewall is offset from the first sidewall, wherein the first sidewall and the second sidewall extend for an entire length of a side of the second semiconductor substrate;
a molding compound over the first semiconductor substrate and around the integrated circuit die;
a redistribution structure over the first semiconductor substrate and the integrated circuit die, wherein the redistribution structure is electrically connected to the integrated circuit die;
a package substrate bonded to the redistribution structure with conductive connectors;
a first dielectric bonding layer physically contacting the first semiconductor substrate; and
a second dielectric bonding layer physically contacting the integrated circuit die and the molding compound, wherein the first dielectric bonding layer and the second dielectric bonding layer physically contact each other.

2. The package of claim 1, wherein the second semiconductor substrate further comprises a fourth sidewall opposite the first sidewall and the second sidewall, and wherein the fourth sidewall is offset from the third sidewall.

3. The package of claim 2, wherein a first distance that the first sidewall is offset from the second sidewall is equal to a second distance that the fourth sidewall is offset from the third sidewall.

4. The package of claim 2, wherein a first distance that the first sidewall is offset from the second sidewall is greater than a second distance that the fourth sidewall is offset from the third sidewall.

5. The package of claim 1, wherein the third sidewall is linear and extends continuously from a topmost surface of the second semiconductor substrate to a bottommost surface of the second semiconductor substrate.

6. The package of claim 1 further comprising a plurality of conductive vias in the first semiconductor substrate.

7. A package comprising:
a bulk substrate;
a device die bonded to the bulk substrate with a dielectric-to-dielectric bond, wherein the device die comprises a semiconductor substrate, and wherein a ratio of a thickness of the bulk substrate to a thickness of the semiconductor substrate is in a range of 0.5 to 2, wherein the dielectric-to-dielectric bond comprises oxide-to-oxide bonds between a first dielectric layer on the bulk substrate and a second dielectric layer on the device die;
a molding compound over the bulk substrate, wherein the molding compound encapsulates the device die without encapsulating the bulk substrate;
a redistribution layer on an opposite side of the device die as the bulk substrate;
a package substrate bonded to the redistribution layer with solder connectors;
a first dielectric bonding layer physically contacting the bulk substrate; and a second dielectric bonding layer physically contacting the device die and the molding compound, wherein the first dielectric bonding layer and the second dielectric bonding layer physically contact each other.

8. The package of claim 7, wherein the bulk substrate further comprises a plurality of through vias.

9. The package of claim 7, wherein the plurality of through vias has a uniform distribution across the bulk substrate.

10. The package of claim 7, wherein the plurality of through vias has a high density in a first region of the bulk substrate compared to a second region of the bulk substrate, and wherein the first region of the bulk substrate overlaps the device die.

11. The package of claim 7, wherein the device die comprises:
 a first exterior sidewall;
 a second exterior sidewall on a same side of the device die as the first exterior sidewall, the first exterior sidewall being offset from the second exterior sidewall; and
 a third exterior sidewall opposite to the first exterior sidewall and the second exterior sidewall.

12. The package of claim 11, wherein the device die further comprises a fourth exterior sidewall opposite to the first exterior sidewall and the second exterior sidewall, wherein the fourth exterior sidewall is offset from the third exterior sidewall.

13. The package of claim 7 wherein the second dielectric bonding layer physically contacts a die attach film, and wherein the die attach film is disposed between the second dielectric bonding layer and the device die.

14. The package of claim 7 further comprising:
 an insulating layer between the first dielectric bonding layer and the bulk substrate; and
 an alignment feature in the insulating layer.

15. A device package comprising:
 a first semiconductor substrate, the first semiconductor substrate being free of active devices;
 an integrated circuit die bonded to the first semiconductor substrate with a dielectric-to-dielectric bond, wherein the integrated circuit die comprises a second semiconductor substrate, and wherein an upper portion of the second semiconductor substrate is wider than a lower portion of the second semiconductor substrate, wherein the dielectric-to-dielectric bond comprises oxide-to-oxide bonds between a first dielectric layer on the first semiconductor substrate and a second dielectric layer on the integrated circuit die;
 a molding compound over the first semiconductor substrate and around the integrated circuit die;
 a redistribution structure over the first semiconductor substrate and the integrated circuit die, wherein the redistribution structure is electrically connected to the integrated circuit die; and
 a package substrate bonded to the redistribution structure with conductive connectors.

16. The device package of claim 15 further comprising a plurality of conductive vias in the first semiconductor substrate.

17. The device package of claim 15, wherein the integrated circuit die further comprises an interconnect structure that is coterminous with the upper portion of the second semiconductor substrate.

18. The device package of claim 15, wherein the first semiconductor substrate is coterminous with the molding compound.

19. The device package of claim 15 further comprising a conductive alignment mark between the first semiconductor substrate and the molding compound.

20. The device package of claim 15, wherein a ratio of a thickness of the first semiconductor substrate to a thickness of the second semiconductor substrate is in a range of 0.5 to 2.

* * * * *